(12) United States Patent
Hirakawa et al.

(10) Patent No.: US 9,330,898 B2
(45) Date of Patent: May 3, 2016

(54) SEPARATION SYSTEM, SEPARATION METHOD, PROGRAM AND COMPUTER STORAGE MEDIUM

(75) Inventors: Osamu Hirakawa, Kumamoto (JP); Naoto Yoshitaka, Kumamoto (JP); Masataka Matsunaga, Kumamoto (JP); Norihiko Okamoto, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/818,150

(22) PCT Filed: Mar. 4, 2011

(86) PCT No.: PCT/JP2011/055849
§ 371 (c)(1),
(2), (4) Date: Feb. 21, 2013

(87) PCT Pub. No.: WO2012/026148
PCT Pub. Date: Mar. 1, 2012

(65) Prior Publication Data
US 2013/0146229 A1    Jun. 13, 2013

(30) Foreign Application Priority Data

Aug. 23, 2010  (JP) ................................. 2010-185894

(51) Int. Cl.
*B32B 38/10*   (2006.01)
*H01L 21/02*   (2006.01)
(Continued)

(52) U.S. Cl.
CPC .... *H01L 21/02076* (2013.01); *H01L 21/02057* (2013.01); *H01L 21/67051* (2013.01);
(Continued)

(58) Field of Classification Search
CPC .... B32B 38/10; B32B 47/006; B32B 43/006; Y10T 156/19; Y10T 156/1972; Y10T 156/1168; Y10T 156/1132; Y10T 156/1153; Y10T 156/1911; Y10T 156/1944; H01L 21/02076; H01L 21/02057; H01L 21/67051; H01L 21/67092
See application file for complete search history.

(56) References Cited

U.S. PATENT DOCUMENTS 5,447,596 A * 9/1995 Hayase .......................... 156/750
6,076,585 A * 6/2000 Klingbeil et al. ............. 156/701
(Continued)

FOREIGN PATENT DOCUMENTS

CN           1258092 A        6/2000
CN           1258093 A        6/2000
(Continued)

OTHER PUBLICATIONS

International Search Report issued on May 31, 2011 for WO2012/026148A1.

*Primary Examiner* — Mark A Osele
*Assistant Examiner* — Nickolas Harm
(74) *Attorney, Agent, or Firm* — Abelman, Frayne & Schwab

(57) ABSTRACT

The present invention is used for separating a superposed substrate in which a processing target substrate and a supporting substrate are joined together with an adhesive into the processing target substrate and the supporting substrate, and includes: a separation processing station performing predetermined processing on the processing target substrate, the supporting substrate, and the superposed substrate; a transfer-in/out station transferring the substrates into/from the separation processing station; and a transfer unit transferring the substrates between the separation processing station and the transfer-in/out station, wherein the separation processing station includes: a separation unit separating the superposed substrate into the processing target substrate and the supporting substrate; a first cleaning unit cleaning the processing target substrate separated in the separation unit; and a second cleaning unit cleaning the supporting substrate separated in the separation unit.

7 Claims, 12 Drawing Sheets

(51) Int. Cl.
 *H01L 21/67* (2006.01)
 *B32B 43/00* (2006.01)
(52) U.S. Cl.
 CPC ........... *H01L21/67092* (2013.01); *B32B 38/10* (2013.01); *B32B 43/006* (2013.01); *Y10T 156/11* (2015.01); *Y10T 156/1132* (2015.01); *Y10T 156/1153* (2015.01); *Y10T 156/1168* (2015.01); *Y10T 156/19* (2015.01); *Y10T 156/1911* (2015.01); *Y10T 156/1944* (2015.01)

(56) References Cited

U.S. PATENT DOCUMENTS

| | | | |
|---|---|---|---|
| 6,629,539 | B1 | 10/2003 | Yanagita et al. |
| 6,672,358 | B2 * | 1/2004 | Yanagita et al. ............. 156/750 |
| 6,971,432 | B2 * | 12/2005 | Yanagita et al. ............. 156/750 |
| 8,186,410 | B2 * | 5/2012 | Nakamura et al. ........... 156/750 |
| 2002/0064944 | A1 * | 5/2002 | Chung ............... H01L 21/02063 438/637 |
| 2004/0016637 | A1 * | 1/2004 | Yang ........................ A23D 7/00 204/242 |
| 2004/0045679 | A1 | 3/2004 | Yanagita et al. |
| 2004/0238117 | A1 * | 12/2004 | Kasai ........................... 156/344 |
| 2005/0236114 | A1 * | 10/2005 | Yanagita et al. .............. 156/584 |
| 2008/0045025 | A1 * | 2/2008 | Asako ............... H01L 21/02063 438/706 |
| 2008/0125899 | A1 | 5/2008 | Numakura |
| 2009/0035941 | A1 * | 2/2009 | Park ........................ C23C 16/06 438/675 |
| 2010/0263794 | A1 * | 10/2010 | George ............. H01L 21/67092 156/707 |
| 2011/0253315 | A1 * | 10/2011 | George ........................ 156/718 |

FOREIGN PATENT DOCUMENTS

| | | |
|---|---|---|
| CN | 1971853 A | 5/2007 |
| CN | 101192055 A | 6/2008 |
| DE | 4407735 A | 9/1994 |
| EP | 0999576 A | 5/2000 |
| EP | 0999577 A | 5/2000 |
| FR | 2703187 A | 9/1994 |
| JP | 06-268051 A | 9/1994 |
| JP | 07-078864 A | 3/1995 |
| JP | 07-240355 A | 9/1995 |
| JP | 09-167724 A | 6/1997 |
| JP | 2000-150611 A | 5/2000 |
| JP | 2000-150836 A | 5/2000 |
| JP | 2002-100595 A | 4/2002 |
| JP | 2007-142327 A | 6/2007 |
| JP | 2008-135517 A | 6/2008 |
| JP | 2010-114101 A | 5/2010 |
| KR | 2000-0035285 A | 6/2000 |
| KR | 2001-0045718 A | 6/2001 |
| KR | 20080048410 A | 6/2008 |
| TW | 0468221 A | 1/1992 |
| WO | 2008102603 A | 8/2008 |

* cited by examiner

SEPARATION SYSTEM, SEPARATION METHOD, PROGRAM AND COMPUTER STORAGE MEDIUM

CROSS REFERENCE TO RELATED APPLICATIONS

This application is a national phase of PCT application No. PCT/JP2011/055849, filed on 4 Mar. 2011, which claims priority to Japanese patent application No. 2010-185894, filed on 23 Aug. 2010, all of which are incorporated herein by reference.

TECHNICAL FIELD

The present invention relates to a separation system separating a superposed substrate into a processing target substrate and a supporting substrate, a separation method using the separation system, a program and a computer storage medium.

BACKGROUND ART

In recent years, for example, in a manufacturing process of a semiconductor device, the diameter of a semiconductor wafer (hereinafter, referred to as a "wafer") increasingly becomes larger. Further, the wafer is required to be thinner in a specific process such as mounting. For example, when a thin wafer with a large diameter is transferred or subjected to polishing as it is, warpage or break can occur in the wafer. Therefore, in order to reinforce the wafer, for example, bonding the wafer to a wafer being a supporting substrate or a glass substrate is performed. The predetermined processing such as polishing and the like on the wafer with the wafer being joined with the supporting substrate as described above, and then the wafer and the supporting substrate are separated.

The separation of the wafer and the supporting substrate is performed using, for example, a separation unit. The separation unit has, for example, a first holder holding the wafer, a second holder holding the supporting substrate, and a nozzle jetting liquid between the wafer and the supporting substrate. Then, in this separation unit, by jetting liquid between the joined wafer and supporting substrate from the nozzle at a jetting pressure greater than the joint strength between the wafer and the supporting substrate, preferably, a jetting pressure twice or greater than the joint strength, the separation of the wafer and the supporting substrate is performed (Patent Document 1).

CITATION LIST

Patent Literature

PTL1: Japanese Patent Application Laid-open No. H09-167724

SUMMARY OF INVENTION

Technical Problem

Incidentally, the separation processing of the wafer and the supporting substrate separates the wafer and the supporting substrate as described above, cleans the joint surface of the wafer and the joint surface of the supporting substrate, and then ends.

However, in the case of using the separation unit described in Patent Document 1, the wafer and the supporting substrate are required to be cleaned in discrete apparatuses, but it is not considered at all to efficiently perform the series of separation processing. Therefore, there is room to improve the throughput of the whole separation unit processing.

The present invention has been made in consideration of the above point, and an object thereof is to efficiently perform separation processing of a processing target substrate and a supporting substrate and improve the throughput of the separation processing.

Solution to Problem

To achieve the above object, the present invention is a separation system separating a superposed substrate in which a processing target substrate and a supporting substrate are joined together with an adhesive into the processing target substrate and the supporting substrate, the separation system including: a separation processing station performing predetermined processing on the processing target substrate, the supporting substrate, and the superposed substrate; a transfer-in/out station transferring the processing target substrate, the supporting substrate or the superposed substrate into/from the separation processing station; and a transfer unit transferring the processing target substrate, the supporting substrate or the superposed substrate between the separation processing station and the transfer-in/out station. Further, the separation processing station includes: a separation unit separating the superposed substrate into the processing target substrate and the supporting substrate; a first cleaning unit cleaning the processing target substrate separated in the separation unit; and a second cleaning unit cleaning the supporting substrate separated in the separation unit.

According to the separation system of the present invention, it is possible to separate the superposed substrate into the processing target substrate and the supporting substrate in the separation unit, and then clean the separated processing target substrate in the first cleaning unit and clean the separated supporting substrate in the second cleaning unit. As described above, according to the present invention, a series of separation processing from the separation of the processing target substrate and the supporting substrate to the cleaning of the processing target substrate and the cleaning of the supporting substrate can be efficiently performed in one separation system. Further, the cleaning of the processing target substrate and the cleaning of the supporting substrate can be concurrently performed in the first cleaning unit and the second cleaning unit respectively. Further, while the processing target substrate and the supporting substrate are being separated in the separation unit, other processing target substrate and supporting substrate can also be processed in the first cleaning unit and the second cleaning unit. Therefore, it is possible to efficiently perform the separation processing of the processing target substrate and the supporting substrate and thereby improve the throughput of the separation processing.

The present invention according to another aspect is a separation method of separating a superposed substrate in which a processing target substrate and a supporting substrate are joined together with an adhesive into the processing target substrate and the supporting substrate using a separation system, wherein the separation system includes: a separation processing station including a separation unit separating the superposed substrate into the processing target substrate and the supporting substrate, a first cleaning unit cleaning the processing target substrate separated in the separation unit; and a second cleaning unit cleaning the supporting substrate separated in the separation unit, a transfer-in/out station transferring the processing target substrate, the supporting substrate or the superposed substrate into/from the separation processing station; and a transfer unit transferring the processing target substrate, the supporting substrate or the superposed substrate between the separation processing station and the transfer-in/out station, and wherein the separation method includes: a separation step of separating the superposed substrate into the processing target substrate and the supporting substrate in the separation unit; a first cleaning step of cleaning the processing target substrate separated in the separation step, in the first cleaning unit; and a second cleaning step of cleaning the supporting substrate separated in the separation step, in the second cleaning unit.

The present invention according to still another aspect is a program running on a computer of a control unit controlling the separation system to cause the separation system to perform the separation method.

The present invention according to yet another aspect is a computer-readable storage medium storing the program.

Advantageous Effects of Invention

According to the present invention, it is possible to efficiently perform the separation processing of the processing target substrate and the supporting substrate and thereby improve the throughput of the separation processing.

DESCRIPTION OF EMBODIMENTS

Figure 1:
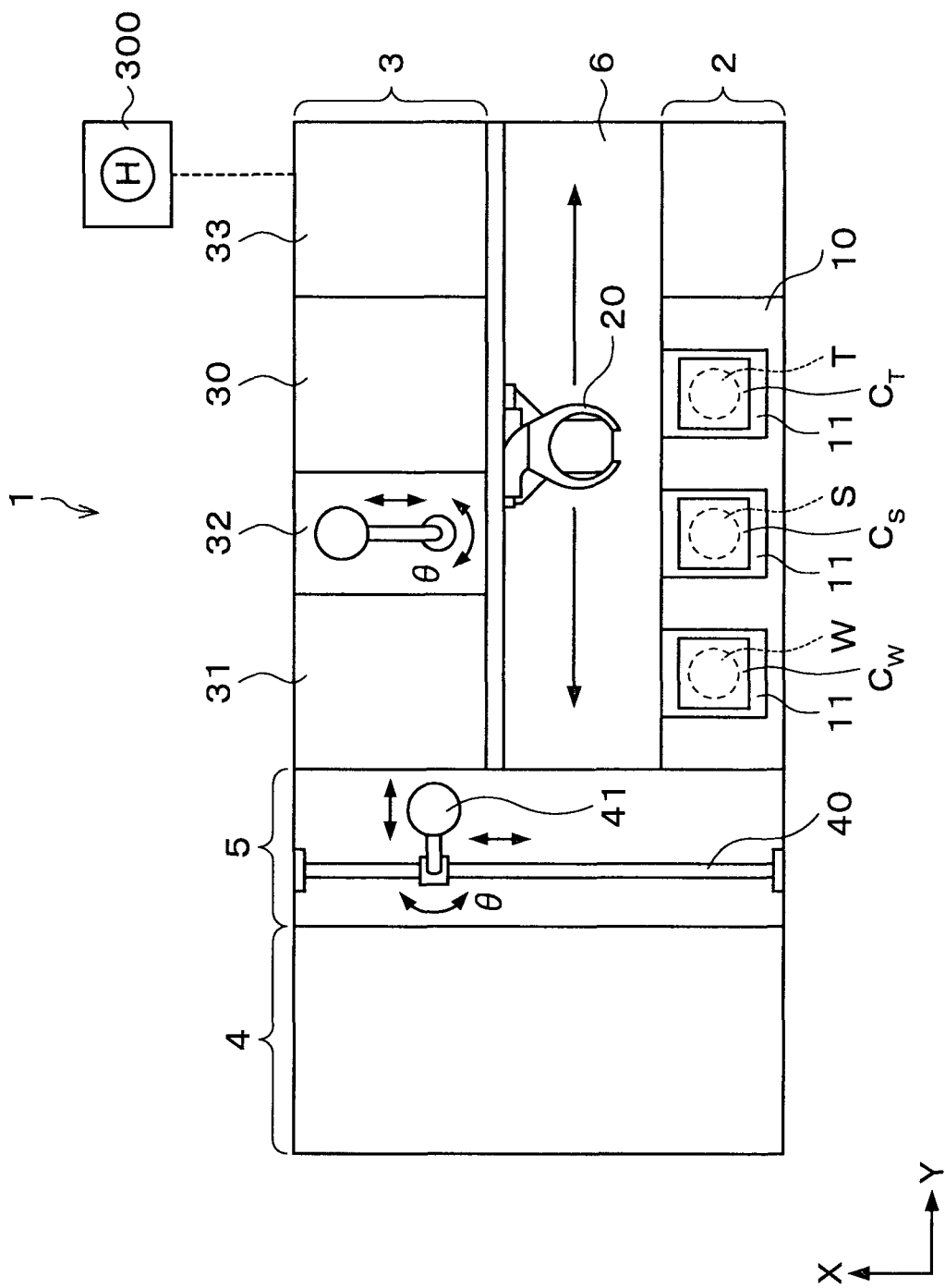
FIG. 1 is a plan view illustrating the outline of a configuration of a separation system according to this embodiment.

Hereinafter, embodiments of the present invention will be described. FIG. 1 is a plan view illustrating the outline of a configuration of a separation system 1 according to this embodiment.

Figure 2:
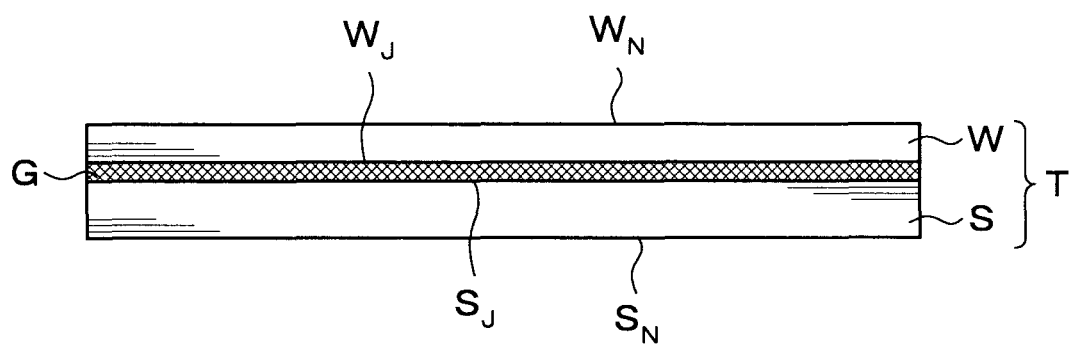
FIG. 2 is a side view of a processing target wafer and a supporting wafer.

In the separation system 1, a superposed wafer T as a superposed substrate in which a processing target wafer W as a processing target substrate and a supporting wafer S as a supporting substrate are joined together with an adhesive G as illustrated in FIG. 2 is separated into the processing target wafer W and the supporting wafer S. Hereinafter, in the processing target wafer W, the surface to be joined with the supporting wafer S via the adhesive G is referred to as a "joint surface $W_J$," and the surface opposite the joint surface $W_J$ is referred to as "a non-joint surface $W_N$." Similarly, in the supporting wafer S, the surface to be joined with the processing target wafer W via the adhesive G is referred to as a "joint surface $S_J$," and the surface opposite the joint surface $S_J$ is referred to as is referred to as "a non-joint surface $S_N$." Note that the processing target wafer W is a wafer which will be a product and a plurality of electronic circuits have been formed, for example, on the joint surface $W_J$. Further, in the processing target wafer W, for example, the non-joint surface $W_N$ has been subjected to polishing to be thinned (for example, with a thickness of 50 µm). The supporting wafer S is a wafer which has the same diameter as that of the processing target wafer W and supports the processing target wafer W. Note that a case of using a wafer as the supporting substrate will be described in this embodiment, but other substrates such as, for example, a glass substrate and the like may be used.

The separation system 1 has, as illustrates in FIG. 1, a configuration in which a transfer-in/out station 2 into/from which cassettes $C_W$, $C_S$, $C_T$ capable of housing a plurality of processing target wafers W, a plurality of supporting wafers S, and a plurality of superposed wafers T respectively are transferred from/to the outside, a separation processing station 3 including various processing and treatment units performing predetermined processing and treatment on the processing target wafer W, the supporting wafer S, and the superposed wafer T, and an interface station 5 delivering the processing target wafer W to/from a post-processing station 4 adjacent to the separation processing station 3, are integrally connected.

The transfer-in/out station 2 and the separation processing station 3 are arranged side by side in an X-direction (a top-bottom direction in FIG. 1). Between the transfer-in/out station 2 and the separation processing station 3, a wafer transfer region 6 is formed. Further, the interface station 5 is located on a Y-direction negative direction side (a left direction side in FIG. 1) of the transfer-in/out station 2, the separation processing station 3 and the wafer transfer region 6.

In the transfer-in/out station 2, a cassette mounting table 10 is provided. On the cassette mounting table 10, a plurality of, for example, three cassette mounting plates 11 are provided. The cassette mounting plates 11 are arranged side by side in a line in a Y-direction (a right-left direction in FIG. 1). On these cassette mounting plates 11, the cassettes $C_W$, $C_S$, $C_T$ can be mounted when the cassettes $C_W$, $C_S$, $C_T$ are transferred in/out from/to the outside of the separation system 1. As described above, the transfer-in/out station 2 is configured to be capable of holding the plurality of processing target wafers W, the plurality of supporting wafers S, and the plurality of superposed wafers T. Note that the number of cassette mounting plates 11 is not limited to this embodiment but can be arbitrarily determined. Further, the plurality of superposed wafers T transferred into the transfer-in/out station 2 have been subjected to inspection in advance and discriminated between a superposed wafer T including a normal processing target wafer W and a superposed wafer T including a defective processing target wafer W.

In the wafer transfer region 6, a first transfer unit 20 is disposed. The first transfer unit 20 has, for example, a transfer arm which is movable, for example, in the vertical direction, the horizontal directions (the X-direction, the Y-direction), and around the vertical axis. The first transfer unit 20 can move in the wafer transfer region 6 and transfer the processing target wafer W, the supporting wafer S, the superposed wafer T between the transfer-in/out station 2 and the separation processing station 3.

The separation processing station 3 has a separation unit 30 separating the superposed wafer T into the processing target wafer W and the supporting wafer S. On the Y-direction negative direction side (a left direction side in FIG. 1) of the separation unit 30, a first cleaning unit 31 cleaning the separated processing target wafer W is disposed. Between the separation unit 30 and the first cleaning unit 31, a second transfer unit 32 as another transfer unit is provided. Further, on the Y-direction positive direction side (a right direction side in FIG. 1) of the separation unit 30, a second cleaning unit 33 cleaning the separated supporting wafer S is disposed. As described above, in the separation processing station 3, the first cleaning unit 31, the second transfer unit 32, the separation unit 30, and the second cleaning unit 33 are arranged side by side in this order from the interface station 5 side.

In the interface station 5, a third transfer unit 41 as another transfer unit which is movable on a transfer path 40 extending in the X-direction is provided. The third transfer unit 41 is also movable in the vertical direction and around the vertical axis (in a θ-direction), and thus can transfer the processing target wafer W between the separation processing station 3 and the post-processing station 4.

Note that in the post-processing station 4, predetermined post-processing is performed on the processing target wafer W separated in the separation processing station 3. As the predetermined post-processing, for example, processing of mounting the processing target wafer W, processing of performing inspection of electric characteristics of the electronic circuits on the processing target wafer W, processing of dicing the processing target wafer W into chips are performed.

Figure 3:
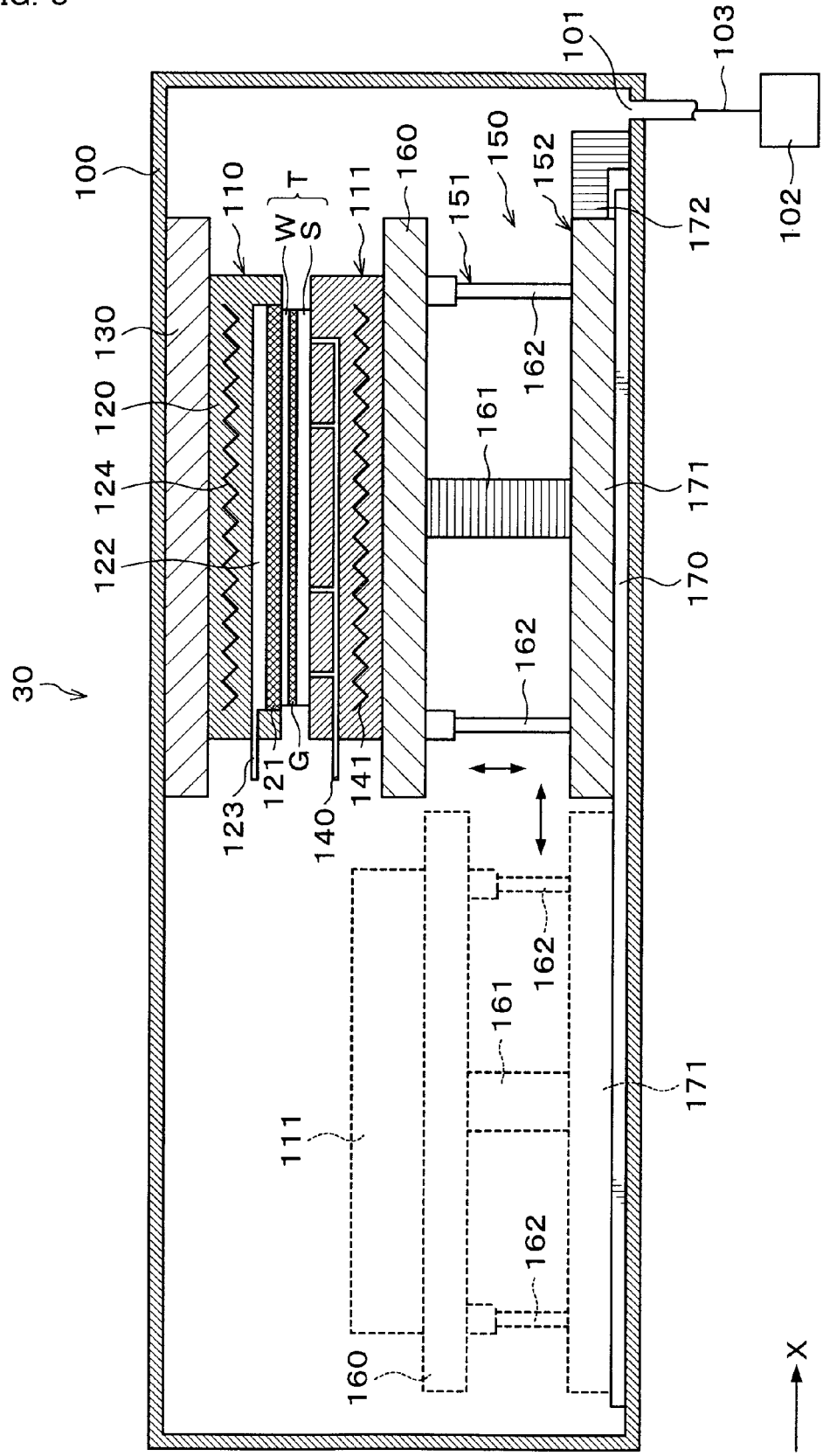
FIG. 3 is a longitudinal sectional view illustrating the outline of a configuration of a separation unit.

Next, the configuration of the above-described separation unit 30 will be described. The separation unit 30 has a processing container 100 hermetically closable the inside thereof as illustrated in FIG. 3. In the side surface of the processing container 100, a transfer-in/out port (not illustrated) for the processing target wafer W, the supporting wafer S, and the superposed wafer T is formed, and an opening/closing shutter (not illustrated) is provided at the transfer-in/out port.

At the bottom surface of the processing container 100, a suction port 101 sucking the atmosphere in the processing container 100 is formed. A suction pipe 103 communicating with a negative pressure generating device 102 such as, for example, a vacuum pump is connected to the suction port 101.

Inside the processing container 100, a first holding part 110 suction-holding the processing target wafer W by its lower surface, and a second holding part 111 mounting and holding the supporting wafer S on its upper surface are provided. The first holding part 110 is provided above the second holding part 111 and disposed to face the second holding part 111. In other words, inside the processing container 100, the separation processing is performed on the superposed wafer T with the processing target wafer W arranged on the upper side and the supporting wafer S arranged on the lower side.

For the first holding part 110, for example, a porous chuck is used. The first holding part 110 has a main body part 120 in a flat plate shape. On the lower surface side of the main body part 120, a porous body 121 is provided. The porous body 121 has, for example, substantially the same diameter as that of the processing target wafer W and is in abutment with the non-joint surface $W_N$ of the processing target wafer W. Note that as the porous body 121, for example, silicon carbide is used.

Further, a suction space 122 is formed inside the main body part 120 and above the porous body 121. The suction space 122 is formed, for example, in a manner to cover the porous body 121. To the suction space 122, a suction pipe 123 is connected. The suction pipe 123 is connected to a negative pressure generating device (not illustrated) such as, for example, a vacuum pump. Then, the non-joint surface $W_N$ of the processing target wafer is sucked from the suction pipe 123 via the suction space 122 and the porous body 121 so that the processing target wafer W is suction-held by the first holding part 110.

Further, inside the main body part 120 and above the suction space 122, a heating mechanism 124 heating the processing target wafer W is provided. For the heating mechanism 124, for example, a heater is used.

On the upper surface of the first holding part 110, a supporting plate 130 supporting the first holding part 110 is provided. The supporting plate 130 is supported on the ceiling surface of the processing container 100. Note that the supporting plate 130 of this embodiment may be omitted, and the first holding part 110 may be supported in abutment with the ceiling surface of the processing container 100.

Inside the second holding part 111, a suction pipe 140 for suction-holding the supporting wafer S is provided. The suction pipe 140 is connected to a negative pressure generating device (not illustrated) such as, for example, a vacuum pump.

Further, inside the second holding part 111, a heating mechanism 141 heating the supporting wafer S is provided. For the heating mechanism 141, for example, a heater is used.

Below the second holding part 111, a moving mechanism 150 moving the second holding part 111 and the supporting wafer S in the vertical direction and the horizontal direction is provided. The moving mechanism 150 has a vertical moving part 151 moving the second holding part 111 in the vertical direction and a horizontal moving part 152 moving the second holding part 111 in the horizontal direction.

The vertical moving part 151 has a supporting plate 160 supporting the lower surface of the second holding part 111, a driving part 161 raising and lowering the supporting plate 160, and supporting members 162 supporting the supporting plate 160. The driving part 161 has, for example, a ball screw (not illustrated) and a motor (not illustrated) turning the ball screw. Further, the supporting members 162 are configure to be extensible and contractible in the vertical direction, and provided, for example at three locations between the supporting plate 160 and a later-described supporting body 171.

The horizontal moving part 152 has a rail 170 extending along an X-direction (a right-left direction in FIG. 3), the supporting body 171 attached to the rail 170, and a driving part 172 moving the supporting body 171 along the rail 170. The driving part 172 has, for example, a ball screw (not illustrated) and a motor (not illustrated) turning the ball screw.

Note that below the second holding part 111, raising and lowering pins (not illustrated) for supporting the superposed wafer T or the supporting wafer S from below and raising and lowering it are provided. The raising and lowering pins pass through through holes (not illustrated) formed in the second holding part 111 and can project from the upper surface of the second holding part 111.

Figure 4:
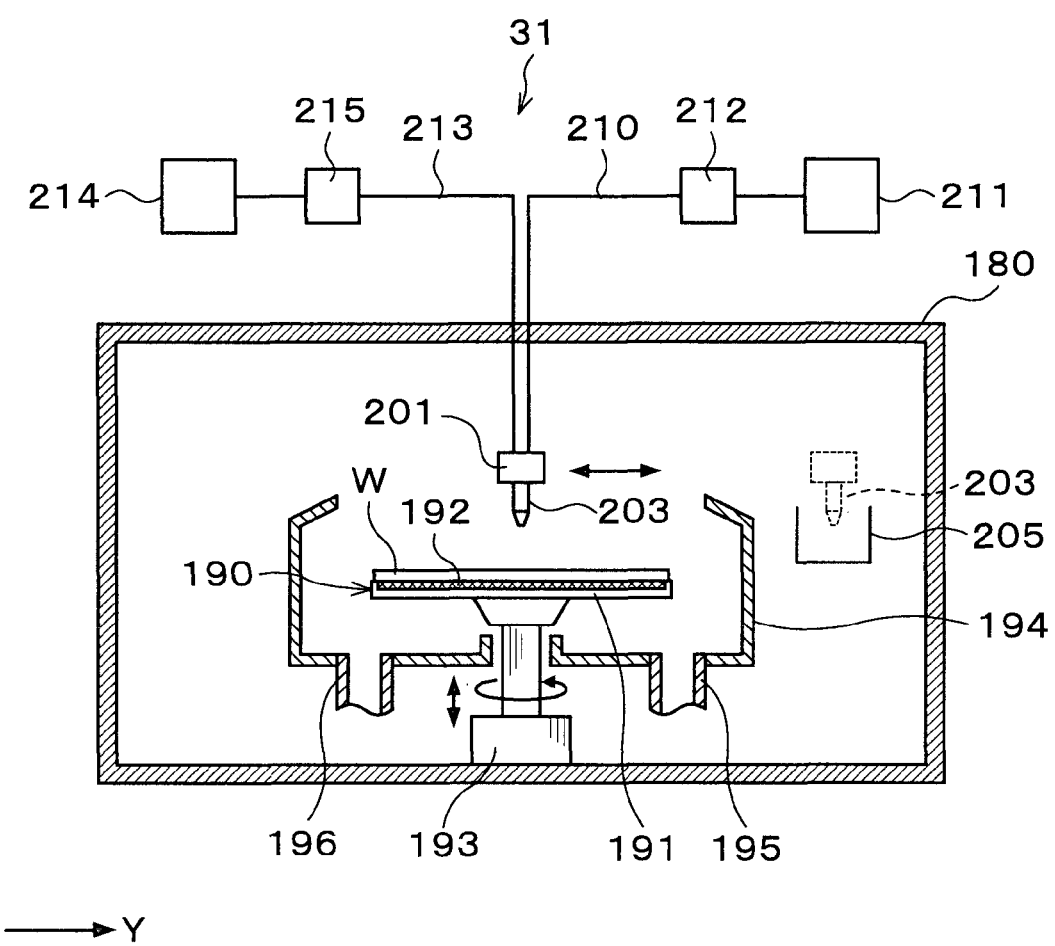
FIG. 4 is a longitudinal sectional view illustrating the outline of a configuration of a first cleaning unit.

Next, the configuration of the above-described first cleaning unit 31 will be described. The first cleaning unit 31 has a processing container 180 hermetically closable the inside thereof as illustrated in FIG. 4. In the side surface of the processing container 180, a transfer-in/out port (not illustrated) for the processing target wafer W is formed, and an opening/closing shutter (not illustrated) is provided at the transfer-in/out port.

At a center portion inside the processing container 180, a porous chuck 190 mounting and rotating the processing target wafer W thereon is provided. The porous chuck 190 has a main body part 191 in a flat plate shape and a porous body 192 provided on the upper surface side of the main body part 191. The porous body 192 has, for example, substantially the same diameter as that of the processing target wafer W and is in abutment with the non-joint surface $W_N$ of the processing target wafer W. Note that as the porous body 192, for example, silicon carbide is used. A suction pipe (not illustrated) is connected to the porous body 192 and sucks the non-joint surface $W_N$ of the processing target wafer W via the porous body 192 from the suction pipe and thereby can suction-hold the processing target wafer W on the porous chuck 190.

Below the porous chuck 190, a chuck driving part 193 equipped with, for example, a motor is provided. The porous chuck 190 can rotate at a predetermined speed by means of the chuck driving part 193. Further, the chuck driving part 193 is provided with a raising and lowering driving source such as, for example, a cylinder so that the porous chuck 190 can freely rise and lower.

Around the porous chuck 190, a cup 194 is provided which receives and collects liquid splashing or dropping from the processing target wafer W. A drain pipe 195 draining the collected liquid and an exhaust pipe 196 evacuating and exhausting the atmosphere in the cup 194 are connected to the lower surface of the cup 194.

Figure 5:
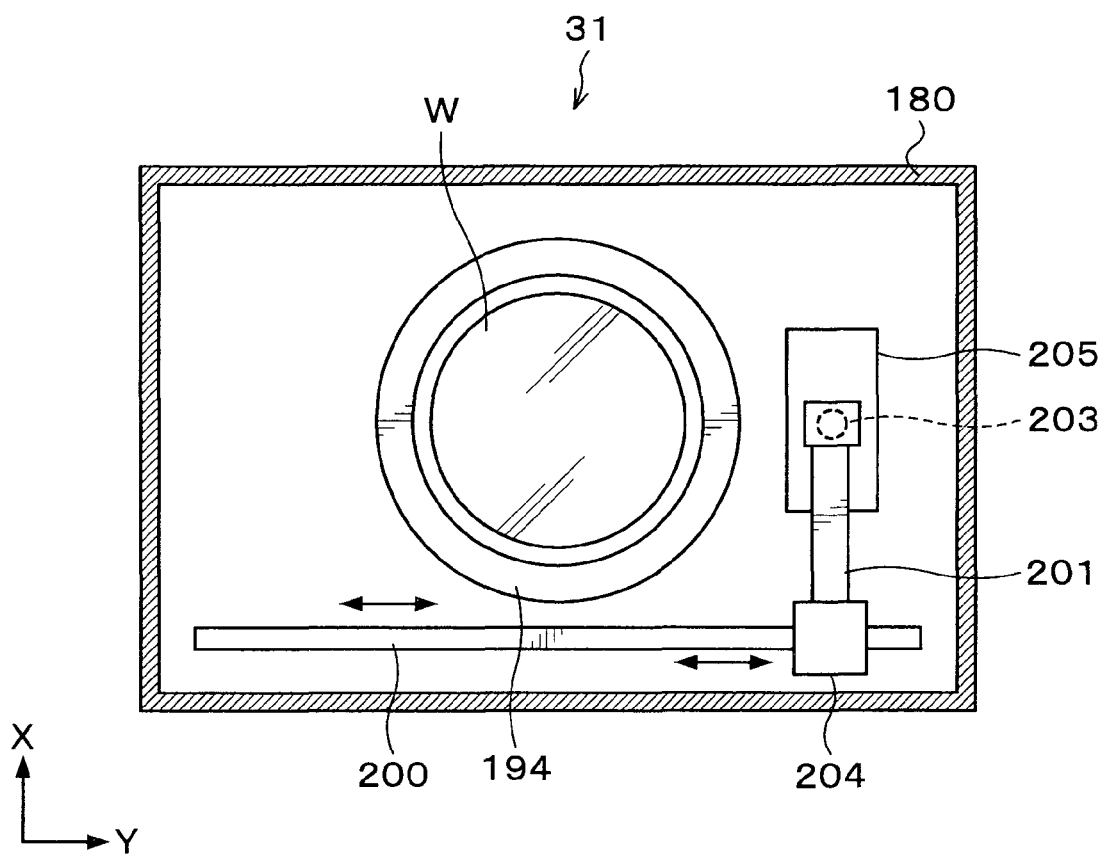
FIG. 5 is a transverse sectional view illustrating the outline of a configuration of the first cleaning unit.

As illustrated in FIG. 5, on an X-direction negative direction (a downward direction in FIG. 5) side of the cup 194, a rail 200 extending along a Y-direction (a right-left direction in FIG. 5) is formed. The rail 200 is formed, for example, from a Y-direction negative direction (a left direction in FIG. 5) side outer position of the cup 194 to a Y-direction positive direction (a right direction in FIG. 5) side outer position. On the rail 200, an arm 201 is attached.

On the arm 201, a cleaning solution nozzle 203 supplying a cleaning solution, for example, an organic solvent onto the processing target wafer W is supported as illustrated in FIG. 4 and FIG. 5. The arm 201 is movable on the rail 200 by means of a nozzle driving part 204 illustrated in FIG. 5. Thus, the cleaning solution nozzle 203 can move from a waiting section 205 provided at the Y-direction positive direction side outer position of the cup 194 to a position above a central portion of the processing target wafer W in the cup 194, and further move in the diameter direction of the processing target wafer W above the processing target wafer W. Further, the arm 201 can freely rise and lower by means of the nozzle driving part 204 to be able to adjust the height of the cleaning solution nozzle 203.

For the cleaning solution nozzle 203, for example, a dual fluid nozzle is used. To the cleaning solution nozzle 203, a supply pipe 210 supplying the cleaning solution to the cleaning solution nozzle 203 is connected as illustrated in FIG. 4. The supply pipe 210 communicates with a cleaning solution supply source 211 storing the cleaning solution therein.

Along the supply pipe 210, a supply equipment group 212 is provided which includes a valve, a flow regulator and so on for controlling the flow of the cleaning solution. Further, a supply pipe 213 supplying an inert gas, for example, a nitrogen gas to the cleaning solution nozzle 203 is connected to the cleaning solution nozzle 203. The supply pipe 213 communicates with a gas supply source 214 storing the inert gas therein. Along the supply pipe 213, a supply equipment group 215 is provided which includes a valve, a flow regulator and so on for controlling the flow of the inert gas. Then, the cleaning solution and the inert gas are mixed in the cleaning solution nozzle 203 and supplied from the cleaning solution nozzle 203 to the processing target wafer W. Note that the mixture of the cleaning solution and the inert gas is sometimes referred to simply as a "cleaning solution" hereinafter.

Incidentally, below the porous chuck 190, raising and lowering pins (not illustrated) for supporting the processing target wafer W from below and raising and lowering it may be provided. In this case, the raising and lowering pins pass through through holes (not illustrated) formed in the porous chuck 190 and can project from the upper surface of the porous chuck 190. Then, in place of raising and lowering the porous chuck 190, the raising and lowering pins are raised or lowered to deliver the processing target wafer W to/from the porous chuck 190.

Figure 6:
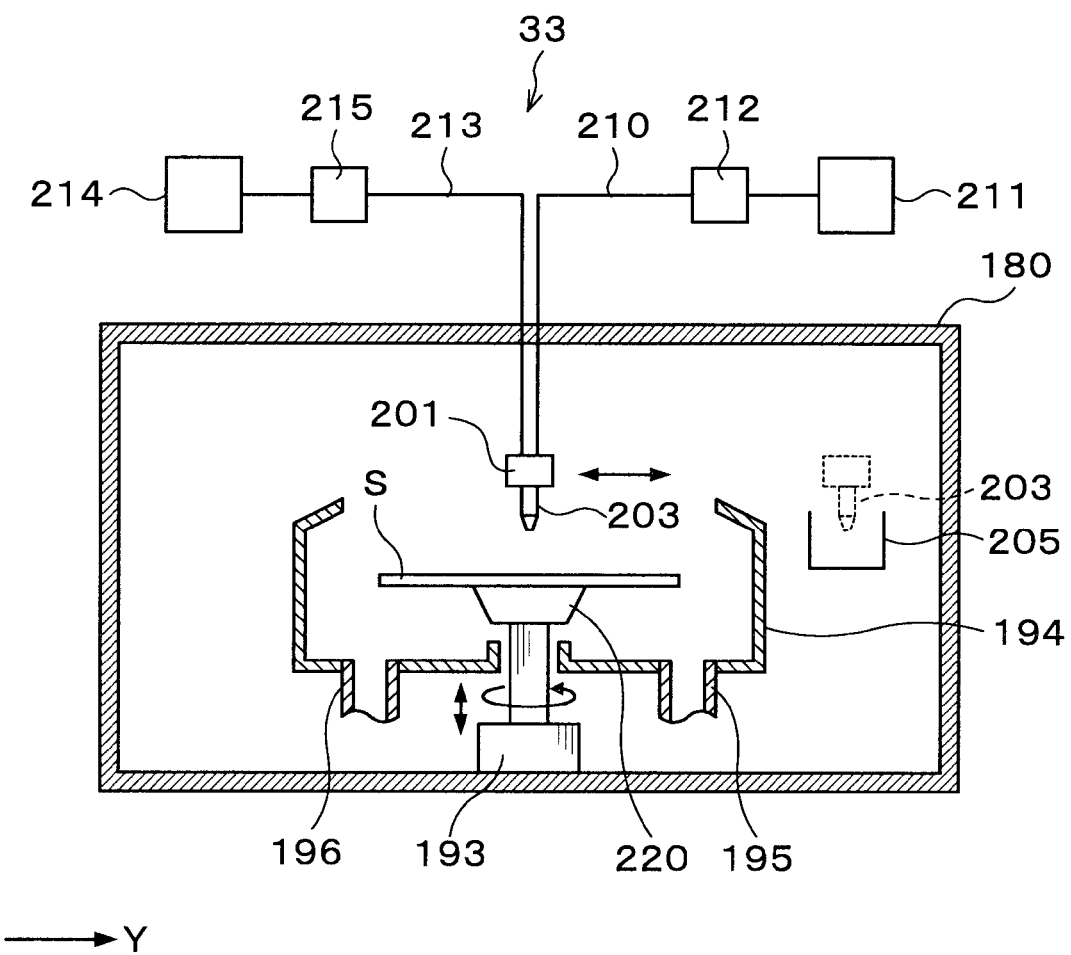
FIG. 6 is a longitudinal sectional view illustrating the outline of a configuration of a second cleaning unit.

Further, the configuration of the second cleaning unit 33 is substantially the same as the configuration of the above-described first cleaning unit 31. In the second cleaning unit 33, a spin chuck 220 is provided as illustrated in FIG. 6 in place of the porous chuck 190 of the first cleaning unit 31. The spin chuck 220 has a horizontal upper surface, and a suction port (not illustrated) sucking, for example, the supporting wafer S is provided in the upper surface. By suction through the suction port, the supporting wafer S can be suction-held on the spin chuck 220. The other configuration of the second cleaning unit 33 is the same as that of the above-described first cleaning unit 31, and therefore the description thereof is omitted.

Incidentally, in the second cleaning unit 33, a back rinse nozzle (not illustrated) jetting a cleaning solution toward the rear surface of the processing target substrate W, namely, the non-joint surface $W_N$ may be provided below the spin chuck 220. The cleaning solution jetted from the back rinse nozzle cleans the non-joint surface $W_N$ of the processing target wafer W and the outer peripheral portion of the processing target substrate W.

Figure 7:
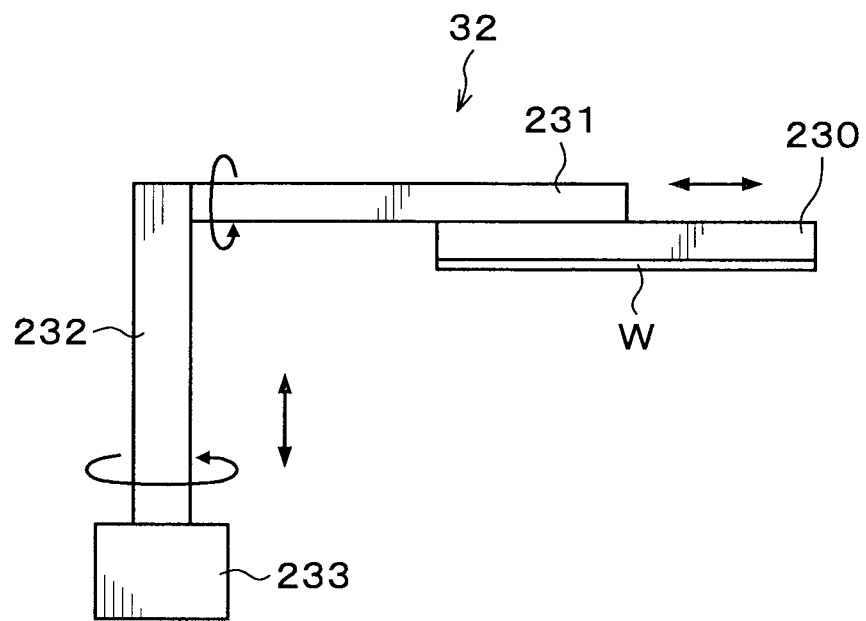
FIG. 7 is a side view illustrating the outline of a configuration of a second transfer unit.

Next, the configuration of the above-described second transfer unit 32 will be described. The second transfer unit 32 has, as illustrated in FIG. 7, a Bernoulli chuck 230 holding the processing target wafer W. The Bernoulli chuck 230 jets air to float the processing target wafer W and thereby can suction-suspend and hold the wafer processing W in a noncontact state. The Bernoulli chuck 230 is supported by a supporting arm 231. The supporting arm 231 is supported by a first driving part 232. By means of the first driving part 232, the supporting arm 231 can turn around the horizontal axis and extend and contract in the horizontal direction. Below the first driving part 232, a second driving part 232 is provided. By means of the second driving part 233, the first driving part 232 can rotate around the vertical axis and rise and lower in the vertical direction.

Note that the third transfer unit 41 has the same configuration as that of the above-described second transfer unit 32, and therefore the description thereof is omitted. However, the second driving part 233 of the third transfer unit 41 is attached to the transfer path 40 illustrated in FIG. 1 so that the third transfer unit 41 is movable on the transfer path 40.

In the above separation system 1, a control unit 300 is provided as illustrated in FIG. 1. The control unit 300 is, for example, a computer and has a program storage part (not illustrated). In the program storage part, a program is stored which controls the processing of the processing target wafer W, the supporting wafer S, and the superposed wafer T in the separation system 1. Further, the program storage part also stores a program controlling the operation of the driving system such as the above-described various processing and treatment units and transfer units to implement the later-described separation processing in the separation system 1. Note that the program may be the one that is stored, for example, in a computer-readable storage medium H such as a computer-readable hard disk (HD), flexible disk (FD), compact disk (CD), magneto-optical disk (MO), or memory card, and installed from the storage medium H into the control unit 300.

Figure 8:
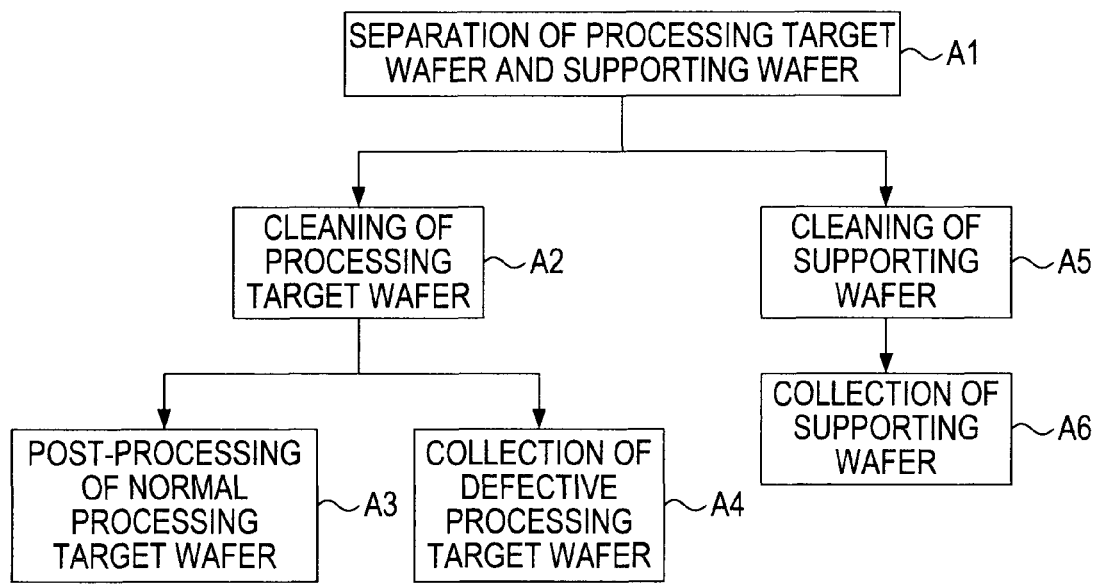
FIG. 8 is a flowchart illustrating main steps of separation processing.

Next, the separation processing method of the processing target wafer W and the supporting wafer S performed using the separation system 1 configured as described above will be described. FIG. 8 is a flowchart illustrating an example of main steps of the separation processing.

First, a cassette $C_T$ housing a plurality of superposed wafers T, an empty cassette $C_W$, and an empty cassette $C_S$ are mounted on the predetermined cassette mounting plates 11 in the transfer-in/out station 2. The superposed wafer T in the cassette $C_T$ is taken out by the first transfer unit 20 and transferred to the separation unit 30 in the separation processing station 3. In this event, the superposed wafer T is transferred with the processing target wafer W arranged on the upper side and the supporting wafer S arranged on the lower side.

Figure 9:
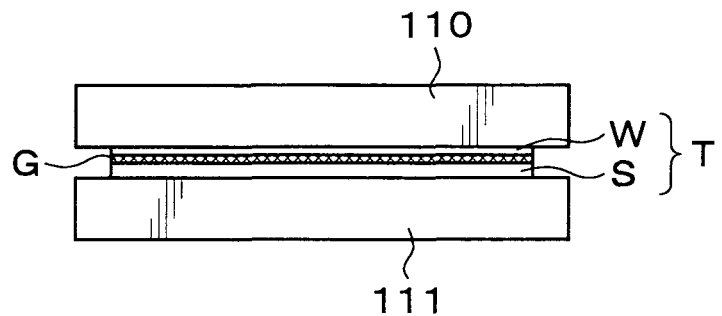
FIG. 9 is an explanatory view illustrating the appearance in which a superposed wafer is held by a first holding part and a second holding part.

The superposed wafer T transferred in the separation unit 30 is suction-held on the second holding part 111. Thereafter, the second holding part 111 is raised by the moving mechanism 150 so that the superposed wafer T is held sandwiched by the first holding part 110 and the second holding part 111 as illustrated in FIG. 9. In this event, the non-joint surface $W_N$ of the processing target wafer W is suction-held by the first holding part 110, and the non-joint surface $S_N$ of the supporting wafer S is suction-held by the second holding part 111.

Thereafter, the heating mechanisms 124, 141 heat the superposed wafer T to a predetermine temperature, for example, 200° C. Then, the adhesive G in the superposed wafer T becomes softened.

Figure 10:
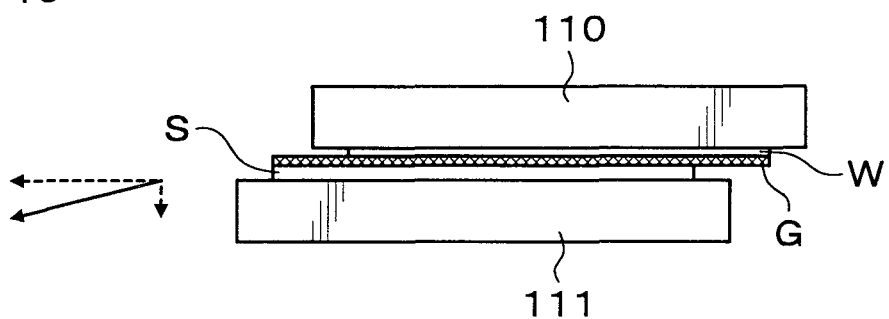
FIG. 10 is an explanatory view illustrating the appearance in which the second holding part is moved in the vertical direction and the horizontal direction.
Figure 11:
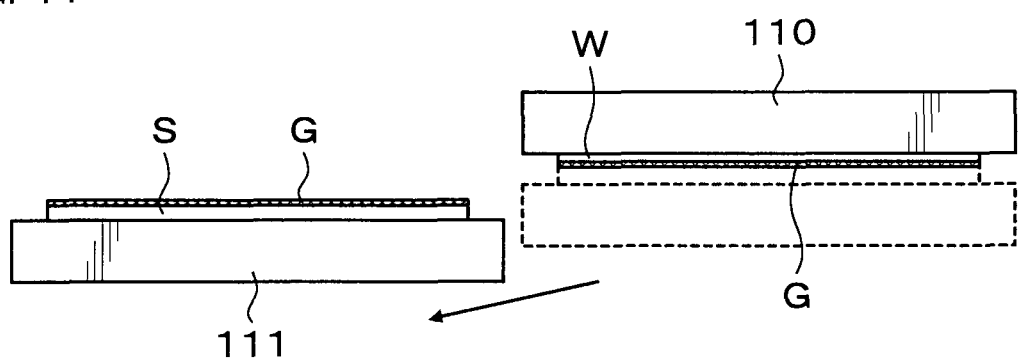
FIG. 11 is an explanatory view illustrating the appearance in which the processing target wafer and the supporting wafer are separated.

Subsequently, while the heating mechanisms 124, 141 are heating the superposed wafer T to keep the softened state of the adhesive G, the second holding part 111 and the supporting wafer S are moved by the moving mechanism 150 in the vertical direction and the horizontal direction, namely, an obliquely downward as illustrated in FIG. 10. Then, as illustrated in FIG. 11, the processing target wafer W held by the first holding part 110 and the supporting wafer S held by the second holding part 111 are separated as illustrated in FIG. 11 (Step A1 in FIG. 8).

In this event, the second holding part 111 moves 100 μm in the vertical direction and moves 300 mm in the horizontal direction. Incidentally, in this embodiment, the thickness of the adhesive G in the superposed wafer T is, for example, 30 μm to 40 μm and the height of the electronic circuit (bump) formed on the joint surface $W_J$ of the processing target wafer W is, for example, 20 μm. Accordingly, the distance between the electronic circuit on the processing target wafer W and the supporting wafer S is minute. Hence, for example, when the second holding part 111 is moved only in the horizontal direction, the electronic circuit and the supporting wafer S can come into contact with each other, whereby the electronic circuit is susceptible to damage. In this regard, moving the second holding part 111 in the horizontal direction and also in the vertical direction as in this embodiment can prevent the contact between the electronic circuit and the supporting wafer S to suppress damage to the electronic circuit. Note that the ratio between the moving distance in the vertical direction and the moving distance in the horizontal direction of the second holding part 111 is set based on the height of the electronic circuit (bump) on the processing target wafer W.

Thereafter, the processing target wafer W separated in the separation unit 30 is transferred by the second transfer unit 32 to the first cleaning unit 31. Here, the transfer method of the processing target wafer W by the second transfer unit 32 will be described.

Figure 12:
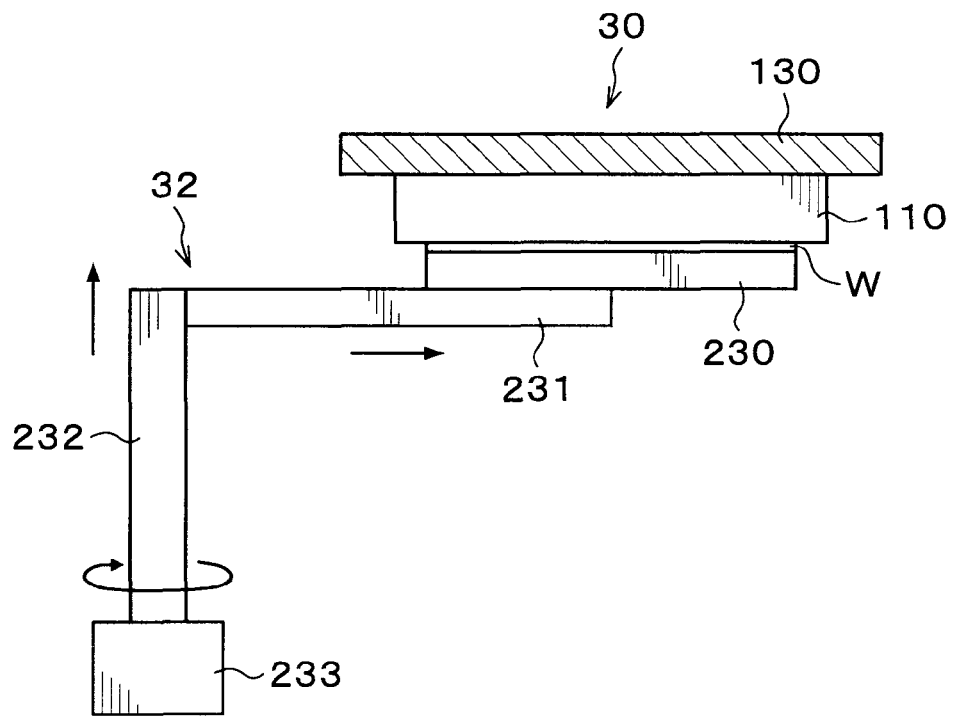
FIG. 12 is an explanatory view illustrating the appearance in which the processing target wafer is delivered from the first holding part to a Bernoulli chuck.

The supporting arm 231 is extended to locate the Bernoulli chuck 230 below the processing target wafer W held by the first holding part 110 as illustrated in FIG. 12. Thereafter, the Bernoulli chuck 230 is raised, and the suction of the processing target wafer W from the suction pipe 123 at the first holding part 110 is stopped. Then, the processing target wafer W is delivered from the first holding part 110 to the Bernoulli chuck 230. In this event, though the joint surface $W_J$ of the processing target wafer W is held by the Bernoulli chuck 230, the processing target wafer W is held with the Bernoulli chuck 230 not in contact therewith, so that the electronic circuits on the joint surface $W_J$ of the processing target wafer W are never damaged.

Figure 13:
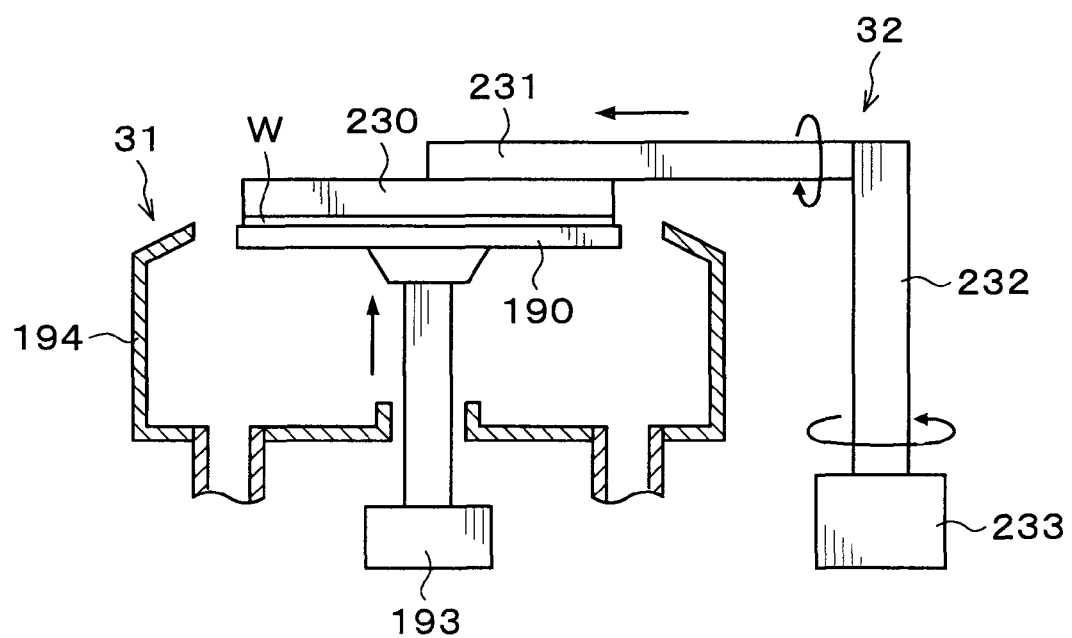
FIG. 13 is an explanatory view illustrating the appearance in which the processing target wafer is delivered from the Bernoulli chuck to a porous chuck.

Next, as illustrated in FIG. 13, the supporting arm 231 is turned to move the Bernoulli chuck 230 to above the porous chuck 190 in the first cleaning unit 31 and reverse the Bernoulli chuck 230 to thereby direct the processing target wafer W downward. In this event, the porous chuck 190 is raised to a position upper than the cup 194 and kept waiting. Thereafter, the processing target wafer W is delivered from the Bernoulli chuck 230 to the porous chuck 190 and suction-held.

Once the processing target wafer W is suction-held on the porous chuck 190 in this manner, the porous chuck 190 is lowered to a predetermined position. Subsequently, the arm 201 moves the cleaning solution nozzle 203 at the waiting section 205 to a position above the central portion of the processing target wafer W. Thereafter, while the porous chuck 190 is rotating the processing target wafer W, the cleaning solution is supplied to the joint surface $W_J$ of the processing target wafer W from the cleaning solution nozzle 203. The supplied cleaning solution is diffused over the entire joint surface $W_J$ of the processing target wafer W by the centrifugal force, whereby the joint surface $W_J$ of the processing target wafer W is cleaned (Step A2 in FIG. 8).

Here, the plurality of superposed wafers T transferred in the transfer-in/out station 2 have been subjected to inspection in advance as described above and discriminated between a superposed wafer T including a normal processing target wafer W and a superposed wafer T including a defective processing target wafer W.

The normal processing target wafer W separated from the normal superposed wafer T is cleaned at its joint surface $W_J$ at Step A2 and then transferred by the third transfer unit 41 to the post-processing station 4. Note that the transfer of the processing target wafer W by the third transfer unit 41 is substantially the same as the above-described transfer of the processing target wafer W by the second transfer unit 32, and therefore the description thereof is omitted. Thereafter, predetermined post-processing is performed on the processing target wafer W in the post-processing station 4 (Step A3 in FIG. 8). In this manner, the processing target wafer W becomes a product.

On the other hand, the defective processing target wafer W separated from the defective superposed wafer T is cleaned at its joint surface $W_J$ at Step A2 and then transferred by the first transfer unit 20 to the transfer-in/out station 2. Thereafter, the defective processing target wafer W is transferred from the transfer-in/out station 2 to the outside and collected (Step A4 in FIG. 8).

While the above-described Steps A2 to A4 are being performed on the processing target wafer W, the supporting wafer S separated in the separation unit 30 is transferred by the first transfer unit 20 to the second cleaning unit 33. Then, in the second cleaning unit 33, the supporting wafer S is cleaned at its joint surface $S_J$ (Step A5 in FIG. 8). Note that the cleaning of the supporting wafer S in the second cleaning unit 33 is the same as the above-described cleaning of the processing target wafer W in the first cleaning unit 31, and therefore the description thereof is omitted.

Thereafter, the supporting wafer S whose joint surface $S_J$ has been cleaned is transferred by the first transfer unit 20 to the transfer-in/out station 2. Then, the supporting wafer S is transferred from the transfer-in/out station 2 to the outside and collected (Step A6 in FIG. 8). Thus, a series of separation processing of the processing target wafer W and the supporting wafer S ends.

According to this embodiment, after the superposed wafer T is separated into the processing target wafer W and the supporting wafer S in the separation unit 30, the separated processing target wafer W can be cleaned in the first cleaning unit 31 and the separated supporting wafer S can be cleaned in the second cleaning unit 33. As described above, according to this embodiment, a series of separation processing from the separation of the processing target wafer W and the supporting wafer S to the cleaning of the processing target wafer W and the cleaning of the supporting wafer S can be efficiently performed in one separation system 1. Further, the cleaning of the processing target wafer W and the cleaning of the supporting wafer S can be concurrently performed in the first cleaning unit 31 and the second cleaning unit 33 respectively. Further, while the processing target wafer W and the supporting wafer S are being separated in the separation unit 30, other processing target wafer W and supporting wafer S can be processed in the first cleaning unit 31 and the second cleaning unit 33. Therefore, it is possible to efficiently perform the separation of the processing target wafer W and the supporting wafer S and thereby improve the throughput of the separation processing.

Further, when the processing target wafer W separated in the separation processing station 3 is the normal processing target wafer W, the processing target wafer W is subjected to the predetermined post-processing into a product in the post-processing station 4. On the other hand, when the processing target wafer W separated in the separation processing station 3 is the defective processing target wafer W, the processing target wafer W is collected from the transfer-in/out station 2. In this manner, only the normal processing target wafer W is made into a product, so that the yield of products can be improved. Further, the defective processing target wafer W is collected and the processing target wafer W can be reused depending on the degree of defects, so that the resource can be effectively used and the manufacturing cost can be reduced.

Further, since the separation of the processing target wafer W and the supporting wafer S to the post-processing of the processing target wafer W can be performed in a series of processes as described above, the throughput of the wafer processing can further be improved.

Further, since the supporting wafer S separated in the separation unit 30 is collected from the transfer-in/out station 2 after cleaning, the supporting wafer S can be reused. Accordingly, the resource can be effectively used and the manufacturing cost can be reduced.

Further, in the separation unit 30, the second holding part 111 and the supporting wafer S are moved by the moving mechanism 150 in the vertical direction and the horizontal direction while the superposed wafer T is being heated to thereby separate the processing target wafer W and the supporting wafer S. Moving the second holding part 111 both in the vertical direction and the horizontal direction as described above can prevent the electronic circuits from coming into contact with the supporting wafer S even if there is a minute distance between the electronic circuits on the processing target wafer W and the supporting wafer S. Accordingly, it is possible to suppress the damage to the electronic circuits and appropriately perform the separation processing of the processing target wafer W and the supporting wafer S.

Further, the second transfer unit 32 and the third transfer unit 41 have the Bernoulli chucks 230 holding the processing target wafer W and therefore can appropriately hold the processing target wafer W even though the processing target wafer W has been made thin. Further, though the joint surface $W_J$ of the processing target wafer W is held by the Bernoulli chuck 230 in the second transfer unit 32, the processing target wafer W is held with the Bernoulli chuck 230 not in contact therewith, so that the electronic circuits on the joint surface $W_J$ of the processing target wafer W are never damaged.

Further, the first cleaning unit 31 has the porous chuck 91 holding the processing target wafer W and therefore can appropriately hold the processing target wafer W even though the processing target wafer W has been made thin.

Figure 14:
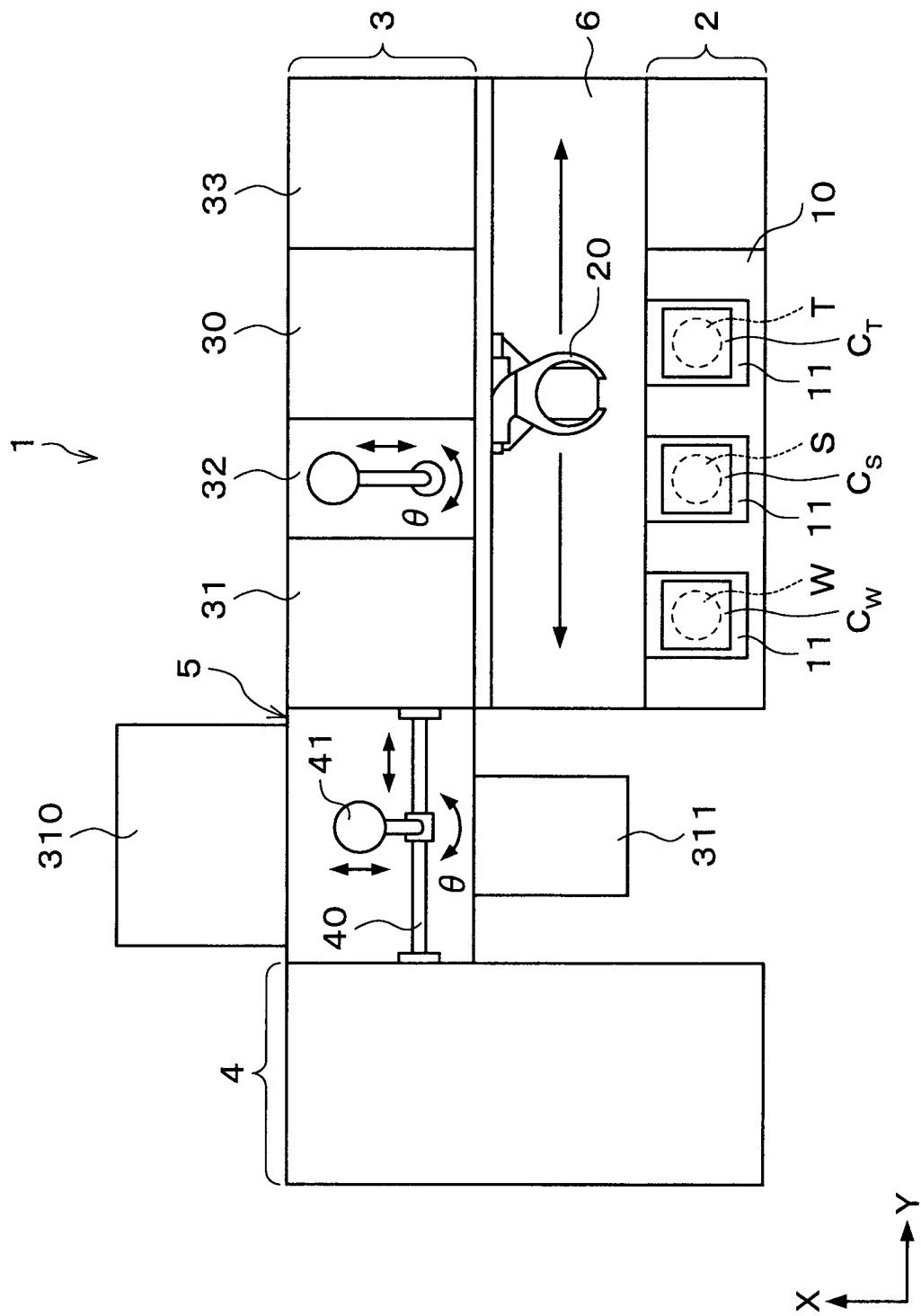
FIG. 14 is a plan view illustrating the outline of a configuration of a separation system according to another embodiment.

In the separation system 1 of the above-described embodiment, an inspection unit 310 inspecting the processing target wafer W separated in the separation processing station 3 may further be provided as illustrated in FIG. 14. The inspection unit 310 is disposed, for example, between the separation processing station 3 and the post-processing station 4. Further, in this case, the transfer path 40 in the interface station 5 is extended in the Y-direction, and the inspection unit 310 is disposed on the X-direction positive direction side of the interface station 5.

Then, in the inspection unit 310, inspection of the front surface (the joint surface $W_J$) of the processing target wafer W is performed. Specifically, the inspection is made for the damage to the electronic circuits on the processing target wafer W and the residual such as the adhesive G on the processing target wafer W.

Further, a cleaning unit 311 for the processing target wafer W may further be provided on the X-direction negative direction side of the interface station 5 as illustrated in FIG. 14. In this case, when the residual of the adhesive G is found on the processing target wafer W in the inspection unit 310, the processing target wafer W is transferred to the cleaning unit 311 and cleaned.

According to the above embodiment, the processing target wafer W can be inspected in the inspection unit 310, so that the processing conditions in the separation system 1 can be corrected based on the inspection result. Accordingly, it is possible to further appropriately separate the processing target wafer W and the supporting wafer S.

Figure 15:
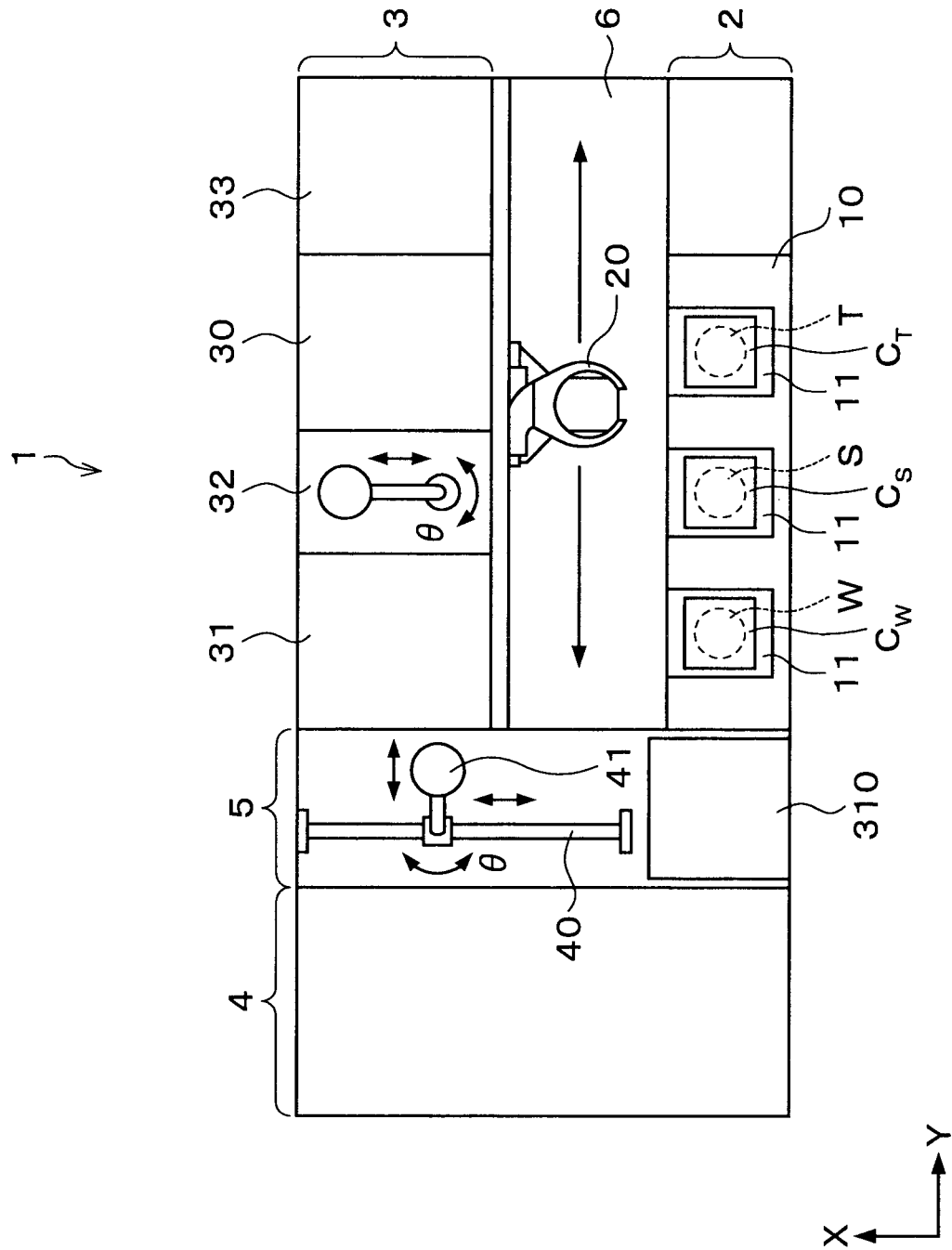
FIG. 15 is a plan view illustrating the outline of a configuration of a separation system according to another embodiment.

Note that the above-described inspection unit 310 may be provided inside the interface station 5 as illustrated in FIG. 15.

Though the second holding part 111 is moved in the vertical direction and the horizontal direction in the separation unit 30 in the above embodiment, the first holding part 110 may be moved in the vertical direction and the horizontal direction. Alternatively, both the first holding part 110 and the second holding part 111 may be moved in the vertical direction and the horizontal direction.

Though the second holding part 111 is moved in the vertical direction and the horizontal direction in the above separation unit 30, the second holding part 111 may be moved only in the horizontal direction and the moving speed of the second holding part 111 may be changed. Specifically, it is adoptable to set the moving speed at the time of starting to move the second holding part 111 to a low speed and then gradually accelerating the moving speed. In other words, since the contact area between the processing target wafer W and the supporting wafer S is large and the electronic circuits on the processing target wafer W are likely to be affected by the adhesive G at the time of starting to move the second holding part 111, the moving speed of the second holding part 111 is set to a low speed. Thereafter, the electronic circuits on the processing target wafer W become unlikely to be affected by the adhesive G as the contact area between the processing target wafer W and the supporting wafer S becomes smaller, and therefore the moving speed of the second holding part 111 is gradually accelerated. Also in this case, it is possible to prevent the contact between the electronic circuits and the supporting wafer S and suppress the damage to the electronic circuits.

Further, though the second holding part 111 is moved in the vertical direction and the horizontal direction in the separation unit 30 in the above embodiment, the second holding part 111 may be moved only in the horizontal direction, for example, when the distance between the electronic circuits on the processing target wafer W and the supporting wafer S is sufficiently large. In this case, it is possible to prevent the contact between the electronic circuits and the supporting wafer S and it becomes easy to control the movement of the second holding part 111. Further, the second holding part 111 may be moved only in the vertical direction to separate the processing target wafer W and the supporting wafer S, or the outer peripheral end portion of the second holding part 111 may be moved only in the vertical direction to separate the processing target wafer W and the supporting wafer S.

Note that though the processing target wafer W and the supporting wafer S are separated with the processing target wafer W arranged on the upper side and the supporting wafer S arranged on the lower side in the above embodiment, the vertical arrangement of the processing target wafer W and the supporting wafer S may be reversed.

In the second transfer unit 32 in the above embodiment, a plurality of supply ports (not illustrated) for supplying the cleaning solution may be formed in the surface of the Bernoulli chuck 230. In this case, when the processing target wafer W is delivered from the Bernoulli chuck 230 to the porous chuck 190 of the first cleaning unit 31, the cleaning solution can be supplied from the Bernoulli chuck 230 to the joint surface $W_J$ of the processing target wafer W to clean the joint surface $W_J$ as well as the Bernoulli chuck 230 itself. This can reduce the subsequent cleaning time of the processing target wafer W in the first cleaning unit 31 and further improve the throughput of the separation processing. In addition, the Bernoulli chuck 230 can also be cleaned and therefore can appropriately transfer the next processing target wafer W.

The third transfer unit 41 has the Bernoulli chuck 230 in the above embodiment but may have a porous chuck (not illustrated) in place of the Bernoulli chuck 230. Also in this case, the porous chuck can appropriately suction-hold the thinned processing target wafer W.

Though the dual fluid nozzle is used for the cleaning nozzles 203 in the first cleaning unit 31 and the second cleaning unit 33 in the above embodiment, the cleaning solution nozzle 203 is not limited to this embodiment but can adopt various nozzles. For example, as the cleaning solution nozzle 203, a nozzle body in which the nozzle supplying the cleaning solution and the nozzle supplying the inert gas are integrated as one body, a spray nozzle, a jet nozzle, a megasonic nozzle or the like may be used. Further, to improve the throughput of the cleaning processing, a cleaning solution heated, for example, at 80° C. may be supplied.

Further, a nozzle supplying IPA (isopropyl alcohol) may be provided in addition to the cleaning solution nozzle 203 in the first cleaning unit 31 and the second cleaning unit 33. In this case, after the processing target wafer W or the supporting wafer S is cleaned with the cleaning solution from the cleaning solution nozzle 203, the cleaning solution on the processing target wafer W or the supporting wafer S is replaced with IPA. This further surely cleans the joint surface $W_J$, $S_J$ of the processing target wafer W or the supporting wafer S.

In the separation system 1 of the above embodiment, a temperature regulator (not illustrated) cooling the processing target wafer W, which has been heated in the separation unit 30, to a predetermined temperature may be provided. In this case, since the temperature of the processing target wafer W is regulated to an appropriate temperature, the processing subsequent thereto can be more smoothly performed.

Further, though the case where the post-processing is performed on the processing target wafer W in the post-processing station 4 has been described in the above embodiment, the present invention is also applicable to the case where a processing target wafer used in the three-dimensional integration technique is separated from a supporting wafer. Note that the three-dimensional integration technique is the technique responding to the demand for higher integration of semiconductor devices in recent years in which a plurality of highly integrated semiconductor devices are three-dimensionally stacked instead of arrangement of the highly integrated semiconductor devices within a horizontal surface. Also in this three-dimensional integration technique, reduction in thickness of the processing target wafers to be stacked is required, and the processing target wafer is joined with the supporting wafer and subjected to the predetermined processing.

Preferred embodiments of the present invention have been described above with reference to the accompanying drawings, but the present invention is not limited to the embodiments. It should be understood that various changes and modifications are readily apparent to those skilled in the art within the scope of the technical spirit as set forth in claims, and those should also be covered by the technical scope of the present invention. The present invention is not limited to the embodiments but can take various forms. The present invention is also applicable to the case where the substrate is a substrate other than the wafer, such as an FPD (Flat Panel Display), a mask reticle for a photomask or the like.

REFERENCE SIGNS LIST

1 separation system
2 transfer-in/out station
3 separation processing station
4 post-processing station
5 interface station
6 wafer transfer region
20 first transfer unit
30 separation unit
31 first cleaning unit 32 second transfer unit
33 second cleaning unit
41 third transfer unit
110 first holding part
111 second holding part
124 heating mechanism
141 heating mechanism
150 moving mechanism
151 vertical moving part
152 horizontal moving part
190 porous chuck
230 Bernoulli chuck
300 control unit
310 inspection unit
G adhesive
S supporting wafer
T superposed wafer
W processing target wafer

The invention claimed is:

1. A separation system separating a superposed substrate in which a processing target substrate and a supporting substrate are joined together with an adhesive into the processing target substrate and the supporting substrate, said separation system comprising:
   a separation processing station performing predetermined processing on the processing target substrate, the supporting substrate, and the superposed substrate;
   a transfer station transferring the processing target substrate, the supporting substrate or the superposed substrate with respect to said separation processing station;
   a transfer unit transferring the processing target substrate, the supporting substrate or the superposed substrate between said separation processing station and said transfer station; and
   an interface station configured to transfer the processing target substrate between said separation processing station and a post-processing station configured to perform a predetermined post-processing on the processing target substrate separated in said separation processing station,
   wherein said separation processing station comprises:
   a separation unit configured to separate the superposed substrate into the processing target substrate and the supporting substrate each held by a first holding part and a second holding part, respectively, the second holding part being configured to move both in a vertical direction and a horizontal direction with respect to the first holding part such that the second holding part is completely separated so as to be spaced apart from the first holding part in an obliquely downward direction, the first holding part having a main body part in a flat plate shape, and a porous body being provided on a lower surface side of the main body with a suction space provided above the porous body and connected to a suction pipe and being abutment with an entire top surface of the processing target substrate;
   a first cleaning unit configured to clean the processing target substrate separated in said separation unit; and
   a second cleaning unit configured to clean the supporting substrate separated in said separation unit,
   wherein said transfer station is configured such that a superposed substrate including a normal processing target substrate determined to be normal by an inspection process and a superposed substrate including a defective processing target substrate determined to be defective by the inspection process are transferred into said transfer station, and
   wherein said separation system further comprises a control unit configured to control said interface station and said transfer unit such that a normal processing target substrate is transferred to said post-processing station after being cleaned in said first cleaning unit and the defective processing target substrate is transferred to said transfer station after being cleaned in said first cleaning unit.

2. The separation system as set forth in claim 1, further comprising:
   an inspection unit provided between said separation processing station and said post-processing station for inspecting the processing target substrate.

3. The separation system as set forth in claim 1,
   wherein said interface station comprises another transfer unit including a Bernoulli chuck or a porous chuck holding the processing target substrate.

4. The separation system as set forth in claim 1,
   wherein said first holding part includes a heating mechanism heating the processing target substrate,
   said second holding part includes a heating mechanism heating the supporting substrate, and
   said separation unit includes a moving mechanism moving at least said first holding part or said second holding part relatively in a horizontal direction.

5. The separation system as set forth in claim 4,
   wherein said moving mechanism moves at least said first holding part or said second holding part relatively in a vertical direction.

6. The separation system as set forth in claim 1,
   wherein said separation processing station comprises another transfer unit transferring the processing target substrate held by a Bernoulli chuck thereof between said separation unit and said first cleaning unit.

7. The separation system as set forth in claim 1,
   wherein said first cleaning unit includes a porous chuck holding the processing target substrate.

* * * * *